United States Patent
Zhao et al.

(10) Patent No.: US 10,680,592 B2
(45) Date of Patent: Jun. 9, 2020

(54) QUADRATURE CLOCK CORRECTION CIRCUIT FOR TRANSMITTERS

(71) Applicant: Xilinx, Inc., San Jose, CA (US)

(72) Inventors: Hai Bing Zhao, Singapore (SG); Kee Hian Tan, Singapore (SG); Ping-Chuan Chiang, Yilan (TW); Yohan Frans, Palo Alto, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/788,617

(22) Filed: Oct. 19, 2017

(65) Prior Publication Data

US 2019/0123728 A1    Apr. 25, 2019

(51) Int. Cl.
*H04L 7/00* (2006.01)
*H04L 7/033* (2006.01)
*H03K 5/156* (2006.01)

(52) U.S. Cl.
CPC ......... *H03K 5/1565* (2013.01); *H04L 7/0016* (2013.01); *H04L 7/033* (2013.01)

(58) Field of Classification Search
CPC ... H03K 5/1565; H04L 7/0016; H04L 7/0025; H04L 7/033
See application file for complete search history.

(56) References Cited

U.S. PATENT DOCUMENTS

| | | | |
|---|---|---|---|
| 6,600,788 B1 | 7/2003 | Dick et al. | |
| 7,012,985 B1 | 3/2006 | Nix | |
| 7,114,055 B1 | 9/2006 | Baxter | |
| 7,254,140 B1 | 8/2007 | Rokhsaz et al. | |
| 7,523,215 B1 | 4/2009 | Robinson et al. | |
| 7,627,046 B1 | 12/2009 | Dick et al. | |
| 7,813,262 B1 | 10/2010 | Rao | |
| 8,059,761 B2 | 11/2011 | Amiri et al. | |
| 8,090,037 B1 | 1/2012 | Harris et al. | |
| 8,139,700 B2 | 3/2012 | Beukema et al. | |
| 8,194,532 B1 | 6/2012 | Whyte | |
| 8,320,770 B2 | 11/2012 | Nedovic | |
| 8,472,307 B1 | 6/2013 | Harris et al. | |

(Continued)

FOREIGN PATENT DOCUMENTS

WO    2012100226    7/2012

OTHER PUBLICATIONS

Frans, Yohan, et al., "A 40-to-64 Gb/s NRZ Transmitter With Supply-Regulated Front-End in 16 nm FinFET," IEEE J. Solid-State Circuits, vol. 51, No. 12, Dec. 2016.

*Primary Examiner* — David B Lugo
(74) *Attorney, Agent, or Firm* — Patterson + Sheridan, LLP (57) ABSTRACT

A quadrature clock correction (QCC) circuit includes: a first pair of clock correction circuits that output in-phase and anti-in-phase clock signals, respectively, of a four-phase clock signal; a second pair of clock correction circuits that output quadrature-phase and anti-quadrature-phase clock signals, respectively, of the four-phase clock signal; a detector circuit configured to detect duty cycle error and in-phase/quadrature-phase (IQ) phase mismatch in the four-phase clock signal; and a calibration circuit configured to supply a first pair of control signals to each the first pair of clock correction circuits, and a second pair of control signals to each of the second pair of clock correction circuits, to correct both the duty cycle error and the IQ phase mismatch based output of the detector circuit.

20 Claims, 9 Drawing Sheets

(56) References Cited

U.S. PATENT DOCUMENTS

| | | |
|---|---|---|
| 8,831,117 B2 | 9/2014 | Rao et al. |
| 8,841,948 B1 | 9/2014 | Chien et al. |
| 9,385,769 B2 | 7/2016 | Elzeftawi |
| 9,602,082 B2 | 3/2017 | Hedayati et al. |
| 10,084,591 B1 * | 9/2018 | Palusa ............... H04L 7/0025 |
| 10,110,239 B1 * | 10/2018 | Shu .................. H03L 7/0996 |
| 2004/0189363 A1 | 9/2004 | Takano |
| 2012/0086489 A1 | 4/2012 | Cherkassky et al. |
| 2015/0180643 A1 * | 6/2015 | Shi .................... H04L 7/0037 |
| | | 375/343 |
| 2015/0303909 A1 * | 10/2015 | Arcudia ............. H03K 5/1565 |
| | | 341/100 |
| 2016/0006596 A1 | 1/2016 | Dickson et al. |
| 2017/0033774 A1 | 2/2017 | Hedayati et al. |

* cited by examiner

QUADRATURE CLOCK CORRECTION CIRCUIT FOR TRANSMITTERS

TECHNICAL FIELD

Examples of the present disclosure generally relate to electronic circuits and, in particular, to a quadrature clock correction circuit for transmitters.

BACKGROUND

A quadrature clock correction circuit is used in a transmitter to compensate for duty cycle error and phase mismatch of the input clock signals. To overcome process, voltage, and temperature (PVT) variations, the calibration scheme implemented by a quadrature clock correction circuit can be either foreground calibration or background calibration. The former provides one-round correction after being turned on, whereas the latter keeps tracking the temperature and supply variations. Without the quadrature clock correction circuit, any timing error between the in-phase and the quadrature-phase clocks will lead to much larger jitter in subsequent stages of the transmitter.

One type of quadrature clock correction circuit divides the correction process into two independent stages. One stage minimizes in-phase/quadrature-phase (IQ) mismatch. The other stage corrects the duty cycle of the IQ phase-corrected clocks. The two-stage structure results in larger power consumption. The IQ phase-correction stage typically employs a variable capacitor at the output to adjust the time delay. The duty cycle correction stage typically employs a resistor array to adjust output rise time and fall time in order to correct duty cycle error. As a result, power consumption is increased due to the internal loading of these techniques.

It is desirable to provide a quadrature clock correction circuit that minimizes power consumption.

SUMMARY

Techniques for quadrature clock correction in transmitters are described. In an example, a transmitter includes: a multiplexer circuit configured to serialize an input signal to generate an output signal based on a four-phase clock signal; a first pair of clock correction circuits that output in-phase and anti-in-phase clock signals, respectively, of the four-phase clock signal; a second pair of clock correction circuits that output quadrature-phase and anti-quadrature-phase clock signals, respectively, of the four-phase clock signal; a detector circuit configured to detect duty cycle error and in-phase/quadrature-phase (IQ) phase mismatch in the four-phase clock signal; and a calibration circuit configured to supply a first pair of control signals to each the first pair of clock correction circuits, and a second pair of control signals to each of the second pair of clock correction circuits, to correct both the duty cycle error and the IQ phase mismatch based output of the detector circuit.

In another example, a method of clock correction in a transmitter includes: outputting in-phase and anti-in-phase clock signals respectively, of a four-phase clock signal from a first pair of clock correction circuits outputting quadrature-phase and anti-quadrature-phase clock signals, respectively, of the four-phase clock signal from a second pair of clock correction circuits; detecting duty cycle error and in-phase/quadrature-phase (IQ) phase mismatch in the four-phase clock signal; providing a first pair of control signals to each the first pair of clock correction circuits, and a second pair of control signals to each of the second pair of clock correction circuits, to correct both the duty cycle error and the IQ phase mismatch based output of the detector circuit.

In another example, a quadrature clock correction (QCC) circuit includes: a first pair of clock correction circuits that output in-phase and anti-in-phase clock signals, respectively, of a four-phase clock signal; a second pair of clock correction circuits that output quadrature-phase and anti-quadrature-phase clock signals, respectively, of the four-phase clock signal; a detector circuit configured to detect duty cycle error and in-phase/quadrature-phase (IQ) phase mismatch in the four-phase clock signal; and a calibration circuit configured to supply a first pair of control signals to each the first pair of clock correction circuits, and a second pair of control signals to each of the second pair of clock correction circuits, to correct both the duty cycle error and the IQ phase mismatch based output of the detector circuit.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Techniques for quadrature clock correction in transmitters are described. In an example, a quadrature clock correction (QCC) circuit includes a first pair of clock correction circuits, a second pair of clock correction circuits, a detector circuit, and a calibration circuit. The a first pair of clock correction circuits output in-phase and anti-in-phase clock signals, respectively, of a four-phase clock signal. The a second pair of clock correction circuits output quadrature-phase and anti-quadrature-phase clock signals, respectively, of the four-phase clock signal. The detector circuit is configured to detect duty cycle error and in-phase/quadrature-phase (IQ) phase mismatch in the four-phase clock signal. The calibration circuit is configured to supply a first pair of control signals to each the first pair of clock correction circuits, and a second pair of control signals to each of the second pair of clock correction circuits, to correct both the duty cycle error and the IQ phase mismatch based output of the detector circuit. In the QCC circuit, two stages of IQ phase correction and DCD correction are merged into a single stage of clock correction. Since the overall number of stages is halved, the power consumption is reduced. These and further aspects are described below with respect to the drawings.

Figure 1:
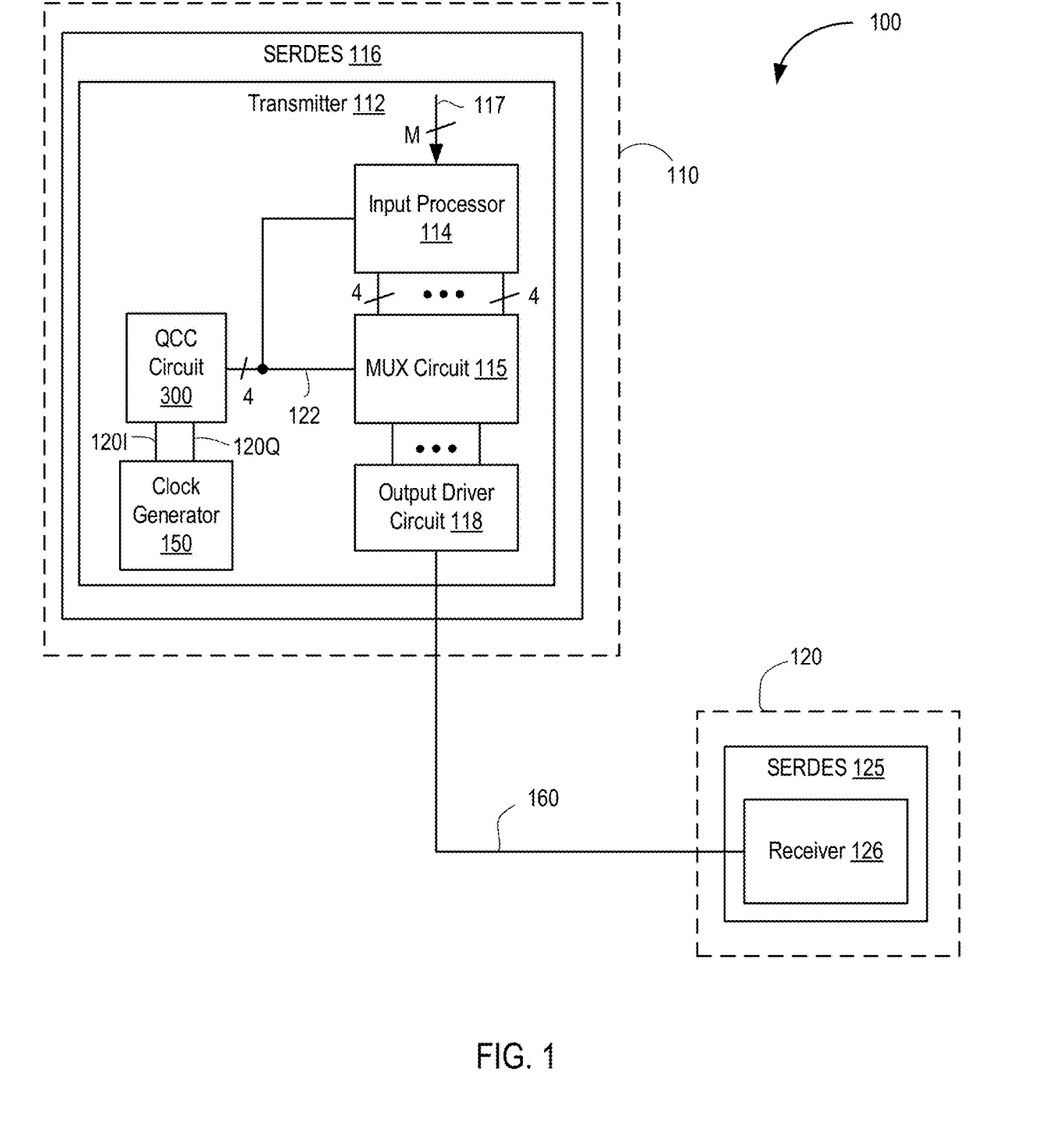
FIG. 1 is a block diagram depicting an example of a serial communication system.

FIG. 1 is a block diagram depicting an example of a serial communication system 100. The serial communication system 100 comprises a transmitter 112 coupled to a receiver 126 over transmission medium 160. The transmitter 112 can be part of a serializer-deserializer (SerDes) 116. The receiver 126 can be part of a SerDes 125. The transmission medium 160 comprises an electrical path between the transmitter 112 and the receiver 126 and can include printed circuit board (PCB) traces, vias, cables, connectors, decoupling capacitors, and the like. The receiver of the SerDes 116, and the transmitter of the SerDes 125, are omitted for clarity. In some examples, the SerDes 116 can be disposed in an integrated circuit (IC) 110, and the SerDes 125 can be disposed in an IC 120.

The transmitter 112 drives serial data onto the transmission medium 160 using a digital baseband modulation technique. In general, the serial data is divided into symbols. The transmitter 112 converts each symbol into an analog voltage mapped to the symbol. The transmitter 112 couples the analog voltage generated from each symbol to the transmission medium 160. In some examples, the transmitter 112 uses a binary non-return-to-zero (NRZ) modulation scheme. In binary NRZ, a symbol is one bit of the serial data and two analog voltages are used to represent each bit. In other examples, the transmitter uses multi-level digital baseband modulation techniques, such as pulse amplitude modulation (PAM), where a symbol includes a plurality of bits of the serial data and more than two analog voltages are used to represent each bit.

The transmitter 112 includes a clock generator circuit ("clock generator 150"), an input serializer 114, a quadrature clock correction (QCC) circuit 300, a multiplexer circuit ("MUX circuit 115"), and an output driver circuit 118. In the example, the input serializer 114 receives an M-bit digital input signal and outputs one or more four-bit digital output signal(s), where M is an integer greater than four (e.g., 128 bits). In some examples, the input serializer 114 can perform pre-emphasis equalization (e.g., using a finite impulse response (FIR) filter or the like). In such case, the outputs of the input serializer 114 can include a pre-cursor output, a main cursor output, and a post-cursor output (each having a bit width of four in the example).

The clock generator 150 generates an in-phase differential clock signal 120I and a quadrature-phase differential clock signal 120Q. Transitions in the quadrature-phase differential clock signal 120Q are 90° out-of-phase with respect to transitions in the in-phase differential clock signal 120I. The QCC circuit 300 converts the in-phase differential clock signal 120I and the quadrature-phase differential clock signal 120Q into a four-phase clock signal 122. The four-phase clock signal 122 includes an in-phase clock signal (cki), an anti-in-phase clock signal (cki_b), a quadrature-phase clock signal (ckq), and an anti-quadrature-phase clock signal (ckq_b). The pair of clock signals cki and ck_b are 180° out-of-phase with each other. Likewise, the pair of clock signals ckq and ckq_b are 180° out-of-phase with each other. The pair of clock signals cki and ckq are 90° out-of-phase with each other. Likewise, the pair of clock signals cki_b and ckq_b are 90° out-of-phase with each other. The QCC circuit 300 supplies the four-phase clock signal 122 to the input serializer 114 and the MUX circuit 115. The QCC circuit 300 performs in-phase/quadrature-phase (IQ) phase error correction and duty cycle correction of the four-phase clock signal 122, as discussed further below.

The MUX circuit 115 includes a multiplexer for each 4-bit output of the input serializer 114. Each multiplexer in the MUX circuit 115 receives a respective one of the 4-bit output(s) of the input serializer 114. For example, multiplexer in the MUX circuit 115 multiplexes its four-bit input into a differential output signal. Hence, the MUX circuit 115 generates high speed output signals.

The output driver circuit 118 includes an output driver for each multiplexer in the MUX circuit 115. Each output driver in the output driver circuit 118 receives a respective one of the differential output signals of the MUX circuit 115. The output driver(s) of the output driver circuit 118 collectively drive a differential signal on the transmission medium 160. The receiver 126 includes conventional components for receiving, equalizing, de-serializing, etc. of the transmitted signal.

While a specific structure of the transmitter 112 is shown by way of example, it is to be understood that the QCC circuit 300 can be used in transmitters having different structures than that shown in FIG. 1.

Figure 2:
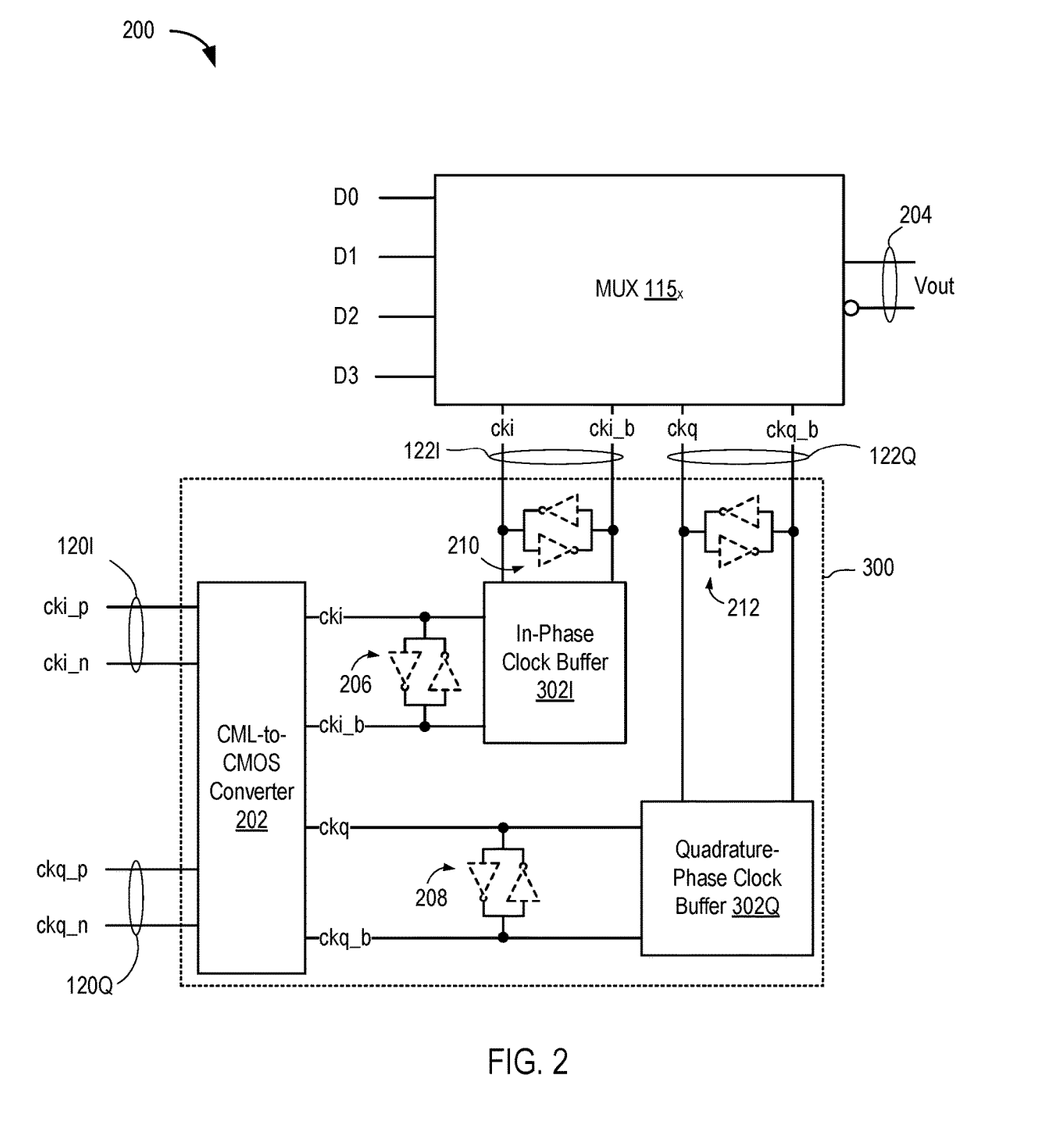
FIG. 2 is a block diagram depicting a portion of a transmitter according to an example.

FIG. 2 is a block diagram depicting a portion 200 of the transmitter 112 according to an example. The portion 200 of the transmitter 112 includes a MUX 115x, which is one of the multiplexer(s) in the MUX circuit 115. The portion 200 of the transmitter 112 also includes the QCC circuit 300. The QCC circuit 300 receives the in-phase differential clock signal 120I and the quadrature-phase differential clock signal 120Q. The in-phase differential clock signal 120I includes a positive component signal (cki_p) and a negative component signal (cki_n). The quadrature-phase differential clock signal 120Q includes a positive component signal (ckq_p) and a negative component signal (ckq_n). The QCC circuit 300 includes a current-mode logic (CML) to complementary metal oxide semiconductor (CMOS) converter 202 that converts the in-phase differential clock signal 120I and the quadrature-phase differential clock signal 120Q into the four-phase clock signal 122 having four single-ended clock signals (i.e., cki, cki_b, ckq, and ckq_b). The four-phase clock signal 122 includes an in-phase clock pair 122I having the clock signals cki and cki_b, and a quadrature-phase clock pair 122Q having the clock signals ckq and ckq_b. The QCC circuit 300 includes an in-phase clock buffer 302I that buffers the in-phase clock pair 122I, and a quadrature-phase clock buffer 320Q that buffers the quadrature-phase clock pair 122Q. The QCC circuit 300 can include zero or more inverter pairs 206 cross-coupled between cki and cki_b before the in-phase clock buffer 302I, and zero or more inverter pairs 210 cross-coupled between cki and cki_b after the in-phase clock buffer 302I. Likewise, the QCC circuit 300 can include zero or more inverter pairs 208 cross-coupled between ckq and ckq_b before the quadrature-phase clock buffer 302Q, and zero or more inverter pairs 212 cross-coupled between ckq and ckq_b after the quadrature-phase clock buffer 302Q. The QCC circuit 300 supplies the four-phase clock signal 122 to the MUX 115x.

The MUX 115x receives a 4-bit input designated D0 . . . D3 in addition to the four-phase clock signal 122. The input signals D0 . . . D3 are quad-rate signals (e.g., four unit interval (UI) periods between transitions). The MUX 115x serializes the input signals D0 . . . D3 into a differential output signal 204 (designated Vout) using the four-phase clock signal 122. The differential output signal 204 is a full-rate signal (e.g., one UI period between transitions). The input signals D0 . . . D3 are single-ended CMOS signals.

Figure 3:
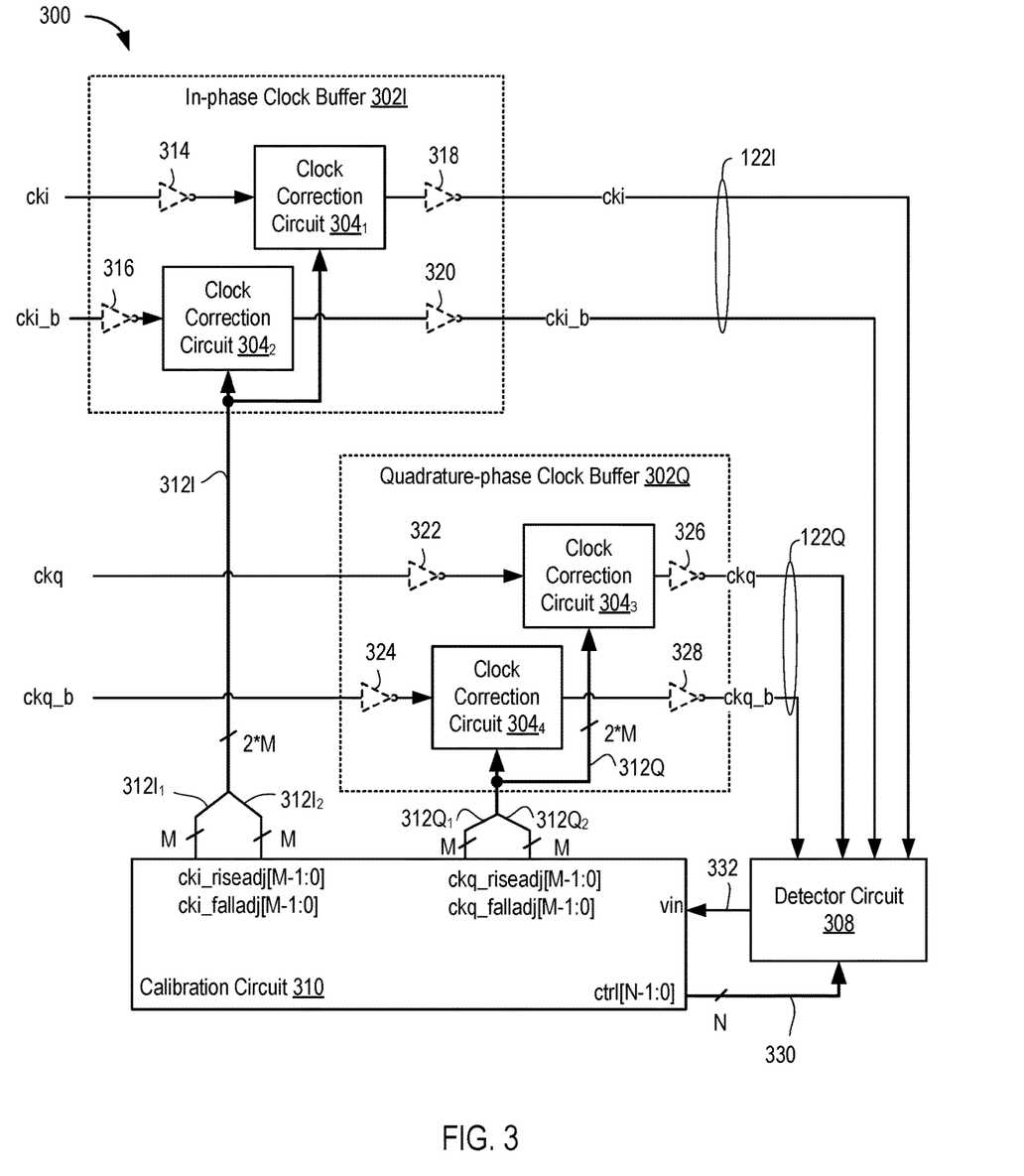
FIG. 3 is a block diagram depicting a quadrature clock correction (QCC) circuit according to an example.

FIG. 3 is a block diagram depicting the QCC circuit 300 according to an example. The QCC circuit 300 includes the in-phase clock buffer 302I, the quadrature-phase clock buffer 302Q, a detector circuit 308, and a calibration circuit 310. The detector circuit 308 receives the four-phase clock signal 122 (clock signals cki, cki_b, ckq, and ckq_b). The detector circuit 308 also receives an N-bit control signal 330 generated by the calibration circuit 310 (where N is a positive integer). The detector circuit 308 generates a control signal 332, as described further below. The detector circuit 308 supplies the control signal 332 to the calibration circuit 310.

The calibration circuit 310 supplies a first pair of control signals $312I_1$ and $312I_2$ (collectively control signal 312I) to the in-phase clock buffer 302I. Each control signal $312I_1$ and $312I_2$ is an M-bit signal (where M is a positive integer, such as eight). The calibration circuit 310 supplies a second pair of control signals $312Q_1$ and $312Q_2$ (collectively control signal 312Q) to the quadrature-phase clock buffer 302Q. Each control signal $312Q_1$ and $312Q_2$ is an M-bit signal. The control signal $312I_1$ is referred to as cki_riseadj, and the control signal $312I_2$ is referred to as cki_falladj. The control signal $312Q_1$ is referred to as ckq_riseadj, and the control signal $312Q_2$ is referred to as ckq_falladj. The control signal 332 received from the detector circuit 308 is referred to as comp. The control signal 330 supplied to the detector circuit 308 is referred to as ctrl.

The in-phase clock buffer 302I includes clock correction circuits $304_1$ and $304_2$. The clock signal cki is coupled to a path that includes zero or more inverters 314, the clock correction circuit $304_1$, and zero or more inverters 318. The clock signal cki_b is coupled to a path that includes zero or more inverters 316, the clock correction circuit $304_2$, and zero or more inverters 320. The control signal 312I is coupled to both of the clock correction circuits $304_1$ and $304_2$.

The quadrature-phase clock buffer 302Q includes clock correction circuits $304_3$ and $304_4$. The clock signal ckq is coupled to a path that includes zero or more inverters 322, the clock correction circuit $304_3$, and zero or more inverters 326. The clock signal ckq_b is coupled to a path that includes zero or more inverters 324, the clock correction circuit $304_4$, and zero or more inverters 328. The control signal 312Q is coupled to both of the clock correction circuits $304_3$ and $304_4$.

The in-phase clock buffer 302I can include zero or more inverter pairs cross-coupled between the cki and cki_b signal paths (not shown). Likewise, the quadrature-phase clock buffer 302Q can include zero or more inverter pairs cross-coupled between the ckq and ckq_b signal paths (not shown).

Figure 4:
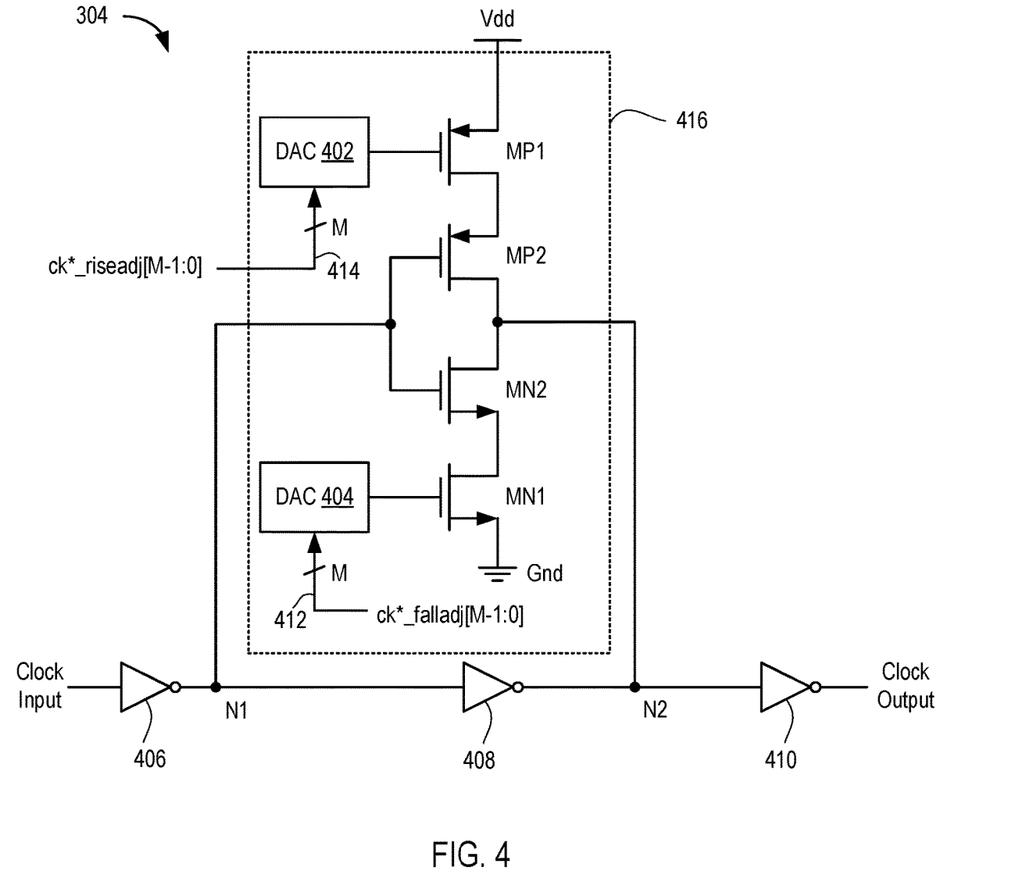
FIG. 4 is a schematic diagram depicting a clock correction circuit according to an example.

FIG. 4 is a schematic diagram depicting a clock correction circuit 304 according to an example. Each clock correction circuit $304_1$ . . . $304_4$ shown in FIG. 3 includes an instance of the clock correction circuit 304 shown in FIG. 4. The clock correction circuit 304 includes an inverter 408 and a control circuit 416. The inverter 408 is coupled between a node N1 and a node N2. In the example shown, the clock correction circuit 304 includes an inverter 406 coupled between a clock input and the node N1, and an inverter 410 coupled between the node N2 and a clock output. The clock input receives a component of one of the in-phase or quadrature-phase differential clock signals 120I, 120Q. The clock output supplies one clock signal of the four-phase clock signal 122. In other examples, one or both of the inverter 406 and the inverter 410 is omitted. That is, the clock input can be directly coupled to the node N1 and/or the clock output can be directly coupled to the node N2. The control circuit 416 is in parallel with the inverter 408 (e.g., coupled between nodes N1 and N2.

The control circuit 416 includes p-channel transistors MP1 and MP2, and n-channel transistors MN1 and MN2, coupled between a source node Vdd and a ground node Gnd. Each p-channel transistor MP1 and MP2 is a p-channel field effect transistor (FET), such as a p-type metal oxide semiconductor FET (MOSFET) (also referred to as a PMOS transistor). Each n-channel transistor MN1 and MN2 is an n-channel FET, such as an n-type MOSFET (also referred to as an NMOS transistor). A source of the p-channel transistor MP1 is coupled to the supply node Vdd. A drain of the p-channel transistor MP1 is coupled to a source of the p-channel transistor MP2. A drain of the p-channel transistor MP2 is coupled to a drain of the n-channel transistor MN2. A source of the n-channel transistor MN2 is coupled to a drain of the n-channel transistor MN1. A source of the n-channel transistor MN1 is coupled to the ground node Gnd. Gates of the p-channel transistor MP2 and the n-channel transistor MN2 are coupled to the node N1. The drains of the p-channel transistor MP2 and the n-channel transistor MN2 are coupled to the node N2. The control circuit 416 further includes a digital-to-analog converter (DAC) 402 and a DAC 404. An analog output of the DAC 402 is coupled to a gate of the transistor MP1. An analog output of the DAC 404 is coupled to a gate of the n-channel transistor MN1. A digital input of the DAC 402 receives an M-bit control signal ck*_riseadj (e.g., cki_riseadj or ckq_riseadj). A digital input of the DAC 404 receives an M-bit control signal ck*_falladj (e.g., cki_falladj or ckq_falladj).

Figure 5:
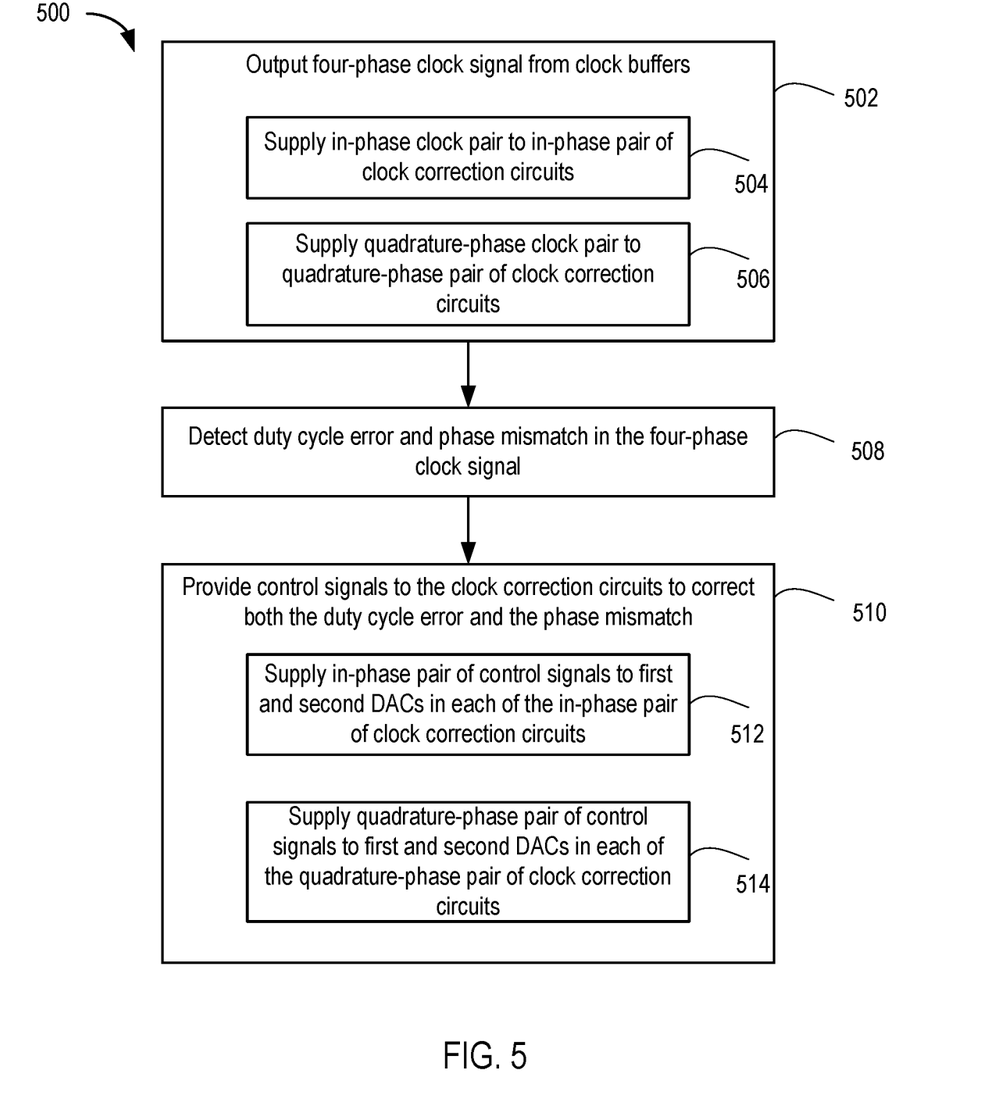
FIG. 5 is a flow diagram depicting a method of clock correction in a transmitter according to an example.

FIG. 5 is a flow diagram depicting a method 500 of clock correction in a transmitter according to an example. Referring to FIGS. 3-5, the four-phase clock signal 122 is output from the clock buffers 302I and 302Q (step 502). The in-phase clock pair 122I is buffered by an in-phase pair of clock correction circuits $304_1$ and $304_2$ (step 504). The quadrature-phase clock pair 122Q is buffered by a quadrature-phase pair of clock correction circuits $304_3$ and $304_4$ (step 506). The detector circuit 308 detects duty cycle error and IQ phase error in the four-phase clock signal (step 508).

Figure 6:
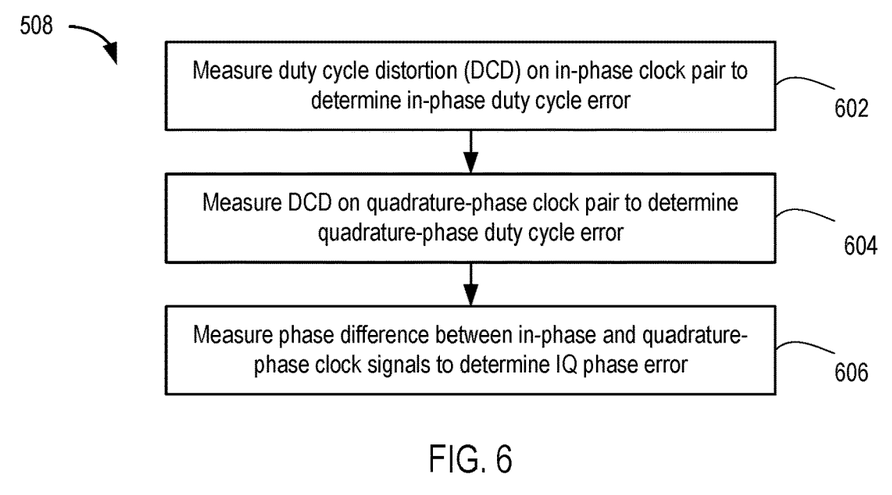
FIG. 6 is a flow diagram depicting a method of detecting duty cycle error and in-phase/quadrature-phase (IQ) phase error according to an example.

FIG. 6 is a flow diagram depicting an example of step 508 for detecting duty cycle error and IQ phase error performed by the detector circuit 308. The calibration circuit 310 and the detector circuit 308 cooperate to implement a detection/correction process that includes: (1) correcting a 180° phase-shift between cki and cki_b; (2) correcting a 180° phase-shift between ckq and ckq_b; and (3) correcting a 90° phase-shift between the in-phase clock pair 122I and the quadrature-phase clock pair 122Q. Any deviation in the ideal 180° phase-shift in the in-phase clock pair 122I, and in the quadrature-phase clock pair 122Q, while result in duty cycle distortion (DCD). The detector circuit 308 can detect DCD in the in-phase clock pair 122I by comparing differences in common-mode level between cki and cki_b. The detector circuit 308 can detect DCD in the quadrature-phase clock pair 122Q using the same process. The detector circuit 308 can detect IQ phase error between the in-phase clock pair 122I and the quadrature-phase clock pair 122Q using symmetric XOR gates.

The calibration circuit 310 provides the control signal (ctrl) to the detector circuit 308 to cause the detector circuit 308 to perform a time-multiplexed sequence of the three detection steps. At step 602, the detector circuit 308 measures DCD on the in-phase clock pair 122I to determine in-phase duty cycle error. At step 604, the detector circuit 308 measures DCD on the quadrature-phase clock pair 122Q to determine quadrature-phase duty cycle error. At step 606, the detector circuit 308 measures a phase difference between the in-phase clock pair 122I and the quadrature-phase clock pair 122Q to determine IQ phase error. The detector circuit 308 outputs one or more comparison results during each step 602 . . . 606. The comparison result(s) are indicative of the in-phase duty cycle error, quadrature duty-cycle error, and IQ phase error, respectively, during each of the three detection phases.

Returning to FIGS. 3-5, the calibration circuit 310 provides control signals to the clock correction circuits $304_1$ . . . $304_4$ to correct both the duty cycle errors and the IQ phase mismatch (step 510). The calibration circuit 310 supplies an in-phase pair of control signals $312I_1$ and $312I_2$ to the first and second DACs 402 and 404 in each of the in-phase pair of clock correction circuits $304_1$ and $304_2$ (step 512). The calibration circuit 310 supplies a quadrature-phase pair of control signals $312Q_1$ and $312Q_2$ to the first and second DACs 402 and 404 in each of the quadrature-phase pair of clock correction circuits $304_3$ and $304_4$ (step 514).

Figure 7:
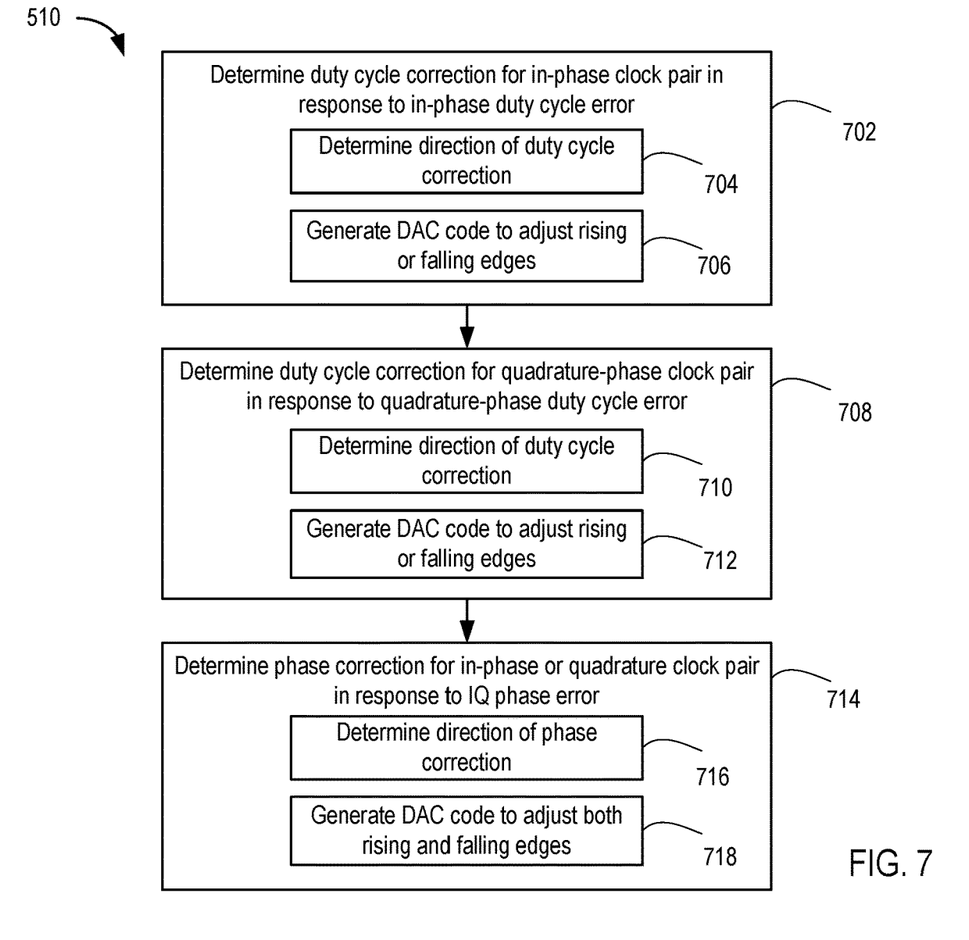
FIG. 7 is a flow diagram depicting a method of controlling clock correction circuits to correct both duty cycle error and IQ phase mismatch.

FIG. 7 is a flow diagram depicting an example of step 510 for controlling the clock correction circuits $304_1$ . . . $304_4$ to correct both duty cycle error and IQ phase mismatch. At step 702, the calibration circuit 310 determines duty cycle correction for the in-phase clock pair 122I in response to the comparison result(s) output by the detector circuit 308 indicative of the in-phase duty cycle error.

In particular, at step 704, the calibration circuit 310 processes the comparison result(s) to determine a direction of the duty cycle correction. At step 706, the calibration circuit 310 generates a DAC code to adjust either the rising edges of the clock signals cki and cki_b, or the falling edges of the clock signals cki and cki_b, in response to the determined direction of the duty cycle correction. To adjust the rising edges, the calibration circuit 310 controls the cki_riseadj signal to increase or decrease the code input to the DAC 402, which increases or decreases the analog voltage applied to the gate of the p-channel transistor MP1. This causes the p-channel transistor MP1 to supply less or more current, which increases or decreases the rise time of the voltage at the node N2. To adjust the falling edges, the calibration circuit 310 controls the cki_falladj signal to increase or decrease the code input to the DAC 404, which increases or decreases the analog voltage applied to the gate of the n-channel transistor MN1. This causes the n-channel transistor MN1 to sink more or less current, which decreases or increases fall time of the voltage at node N2. Notably, during step 702, the calibration circuit 310 controls only one of the DACs 402 and 404 in each clock correction circuit $304_1$ and $304_2$ to adjust one of the rise times or fall times of the clock signals cki and cki_b.

At step 708, the calibration circuit 310 determines duty cycle correction for the quadrature-phase clock pair 122Q in response to the comparison result(s) output by the detector circuit 308 indicative of the quadrature-phase duty cycle error.

In particular, at step 710, the calibration circuit 310 processes the comparison result(s) to determine a direction of the duty cycle correction. At step 712, the calibration circuit 310 generates a DAC code to adjust either the rising edges of the clock signals ckq and ckq_b, or the falling edges of the clock signals ckq and ckq_b, in response to the determined direction of the duty cycle correction. To adjust the rising edges, the calibration circuit 310 controls the ckq_riseadj signal to increase or decrease the code input to the DAC 402, which increases or decreases the analog voltage applied to the gate of the p-channel transistor MP1. This causes the p-channel transistor MP1 to supply less or more current, which increases or decreases the rise time of the voltage at the node N2. To adjust the falling edges, the calibration circuit 310 controls the ckq_falladj signal to increase or decrease the code input to the DAC 404, which increases or decreases the analog voltage applied to the gate of the n-channel transistor MN1. This causes the n-channel transistor MN1 to sink more or less current, which decreases or increases fall time of the voltage at node N2. Notably, during step 708, the calibration circuit 310 controls only one of the DACs 402 and 404 in each clock correction circuit $304_3$ and $304_4$ to adjust one of the rise times or fall times of the clock signals ckq and ckq_b.

At step 714, the calibration circuit 310 determines a phase correction for either the in-phase clock pair 122I or the quadrature-phase clock pair 122Q in response to the IQ phase error. In particular, at step 716, the calibration circuit 310 determines the direction of the phase correction. At step 718, the calibration circuit 310 generates DAC codes to adjust both the rising and falling edges of the clock signals cki and cki_b, or the clock signals ckq_ and ckq_b, depending on which clock pair is selected for adjustment. Notably, during step 714, the calibration circuit controls both the DACs 402 and 404 in each clock correction circuit $304_1$ and $304_2$ (or each clock correction circuit $304_3$ and $304_4$) to adjust both the rise times and fall times of the clock signals cki and cki_b (or the clock signals ckq and ckq_b).

Figure 8:
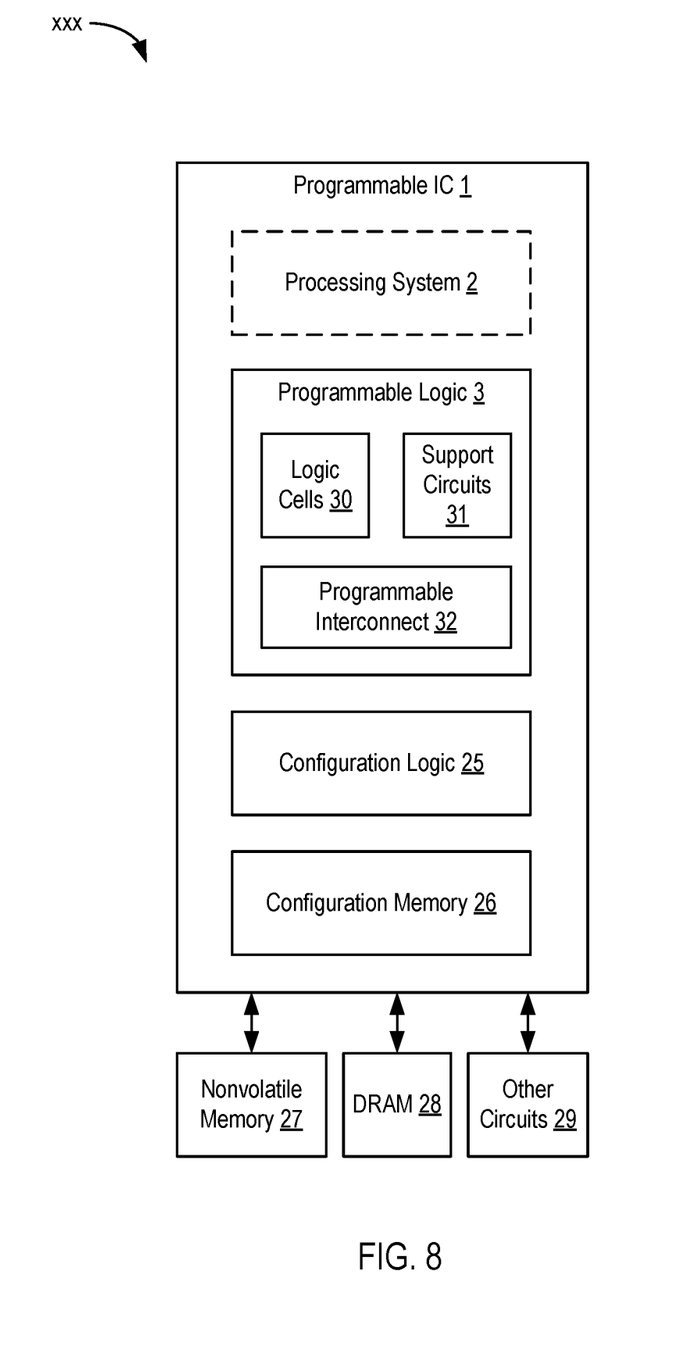
FIG. 8 is a block diagram depicting a programmable integrated circuit (IC) according to an example in which the QCC circuit described herein can be used.

FIG. 8 is a block diagram depicting a programmable IC 1 according to an example in which the QCC circuit 300 described herein can be used. The programmable IC 1 includes programmable logic 3, configuration logic 25, and configuration memory 26. The programmable IC 1 can be coupled to external circuits, such as nonvolatile memory 27, DRAM 28, and other circuits 29. The programmable logic 3 includes logic cells 30, support circuits 31, and programmable interconnect 32. The logic cells 30 include circuits that can be configured to implement general logic functions of a plurality of inputs. The support circuits 31 include dedicated circuits, such as transceivers, input/output blocks, digital signal processors, memories, and the like. The logic cells and the support circuits 31 can be interconnected using the programmable interconnect 32. Information for programming the logic cells 30, for setting parameters of the support circuits 31, and for programming the programmable interconnect 32 is stored in the configuration memory 26 by the configuration logic 25. The configuration logic 25 can obtain the configuration data from the nonvolatile memory 27 or any other source (e.g., the DRAM 28 or from the other circuits 29). In some examples, the programmable IC 1 includes a processing system 2. The processing system 2 can include microprocessor(s), memory, support circuits, IO circuits, and the like.

Figure 9:
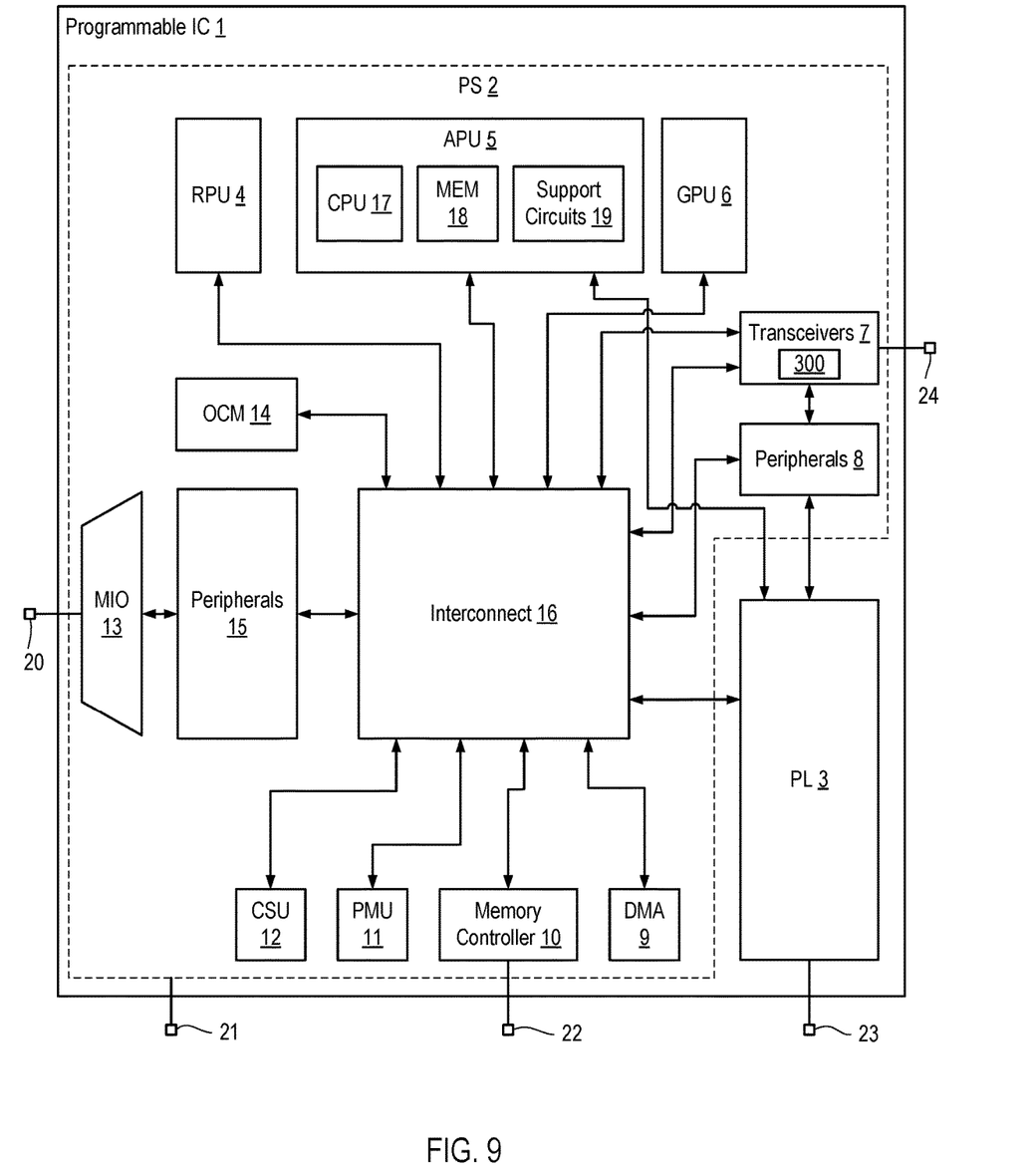
FIG. 9 is a block diagram depicting a System-on-Chip (SoC) implementation of a programmable IC according to an example in which the QCC circuit described herein can be used.

FIG. 9 is a block diagram depicting a System-on-Chip (SoC) implementation of the programmable IC 1 according to an example. In the example, the programmable IC 1 includes the processing system 2 and the programmable logic 3. The processing system 2 includes various processing units, such as a real-time processing unit (RPU) 4, an application processing unit (APU) 5, a graphics processing unit (GPU) 6, a configuration and security unit (CSU) 12, a platform management unit (PMU) 122, and the like. The processing system 2 also includes various support circuits, such as on-chip memory (OCM) 14, transceivers 7, peripherals 8, interconnect 16, DMA circuit 9, memory controller 10, peripherals 15, and multiplexed IO (MIO) circuit 13. The processing units and the support circuits are interconnected by the interconnect 16. The PL 3 is also coupled to the interconnect 16. The transceivers 7 are coupled to external pins 24. The PL 3 is coupled to external pins 23. The memory controller 10 is coupled to external pins 22. The MIO 13 is coupled to external pins 20. The PS 2 is generally coupled to external pins 21. The APU 5 can include a CPU 17, memory 18, and support circuits 19.

Referring to the PS 2, each of the processing units includes one or more central processing units (CPUs) and associated circuits, such as memories, interrupt controllers, direct memory access (DMA) controllers, memory management units (MMUs), floating point units (FPUs), and the like. The interconnect 16 includes various switches, busses, communication links, and the like configured to interconnect the processing units, as well as interconnect the other components in the PS 2 to the processing units.

The OCM 14 includes one or more RAM modules, which can be distributed throughout the PS 2. For example, the OCM 14 can include battery backed RAM (BBRAM), tightly coupled memory (TCM), and the like. The memory controller 10 can include a DRAM interface for accessing external DRAM. The peripherals 8, 15 can include one or more components that provide an interface to the PS 2. For example, the peripherals 15 can include a graphics processing unit (GPU), a display interface (e.g., DisplayPort, high-definition multimedia interface (HDMI) port, etc.), universal serial bus (USB) ports, Ethernet ports, universal asynchronous transceiver (UART) ports, serial peripheral interface (SPI) ports, general purpose IO (GPIO) ports, serial advanced technology attachment (SATA) ports, PCIe ports, and the like. The peripherals 15 can be coupled to the MIO 13. The peripherals 8 can be coupled to the transceivers 7. The transceivers 7 can include serializer/deserializer (SER-DES) circuits, MGTs, and the like. The transceivers 7 can include instance(s) of the QCC circuit 300.

Figure 10:
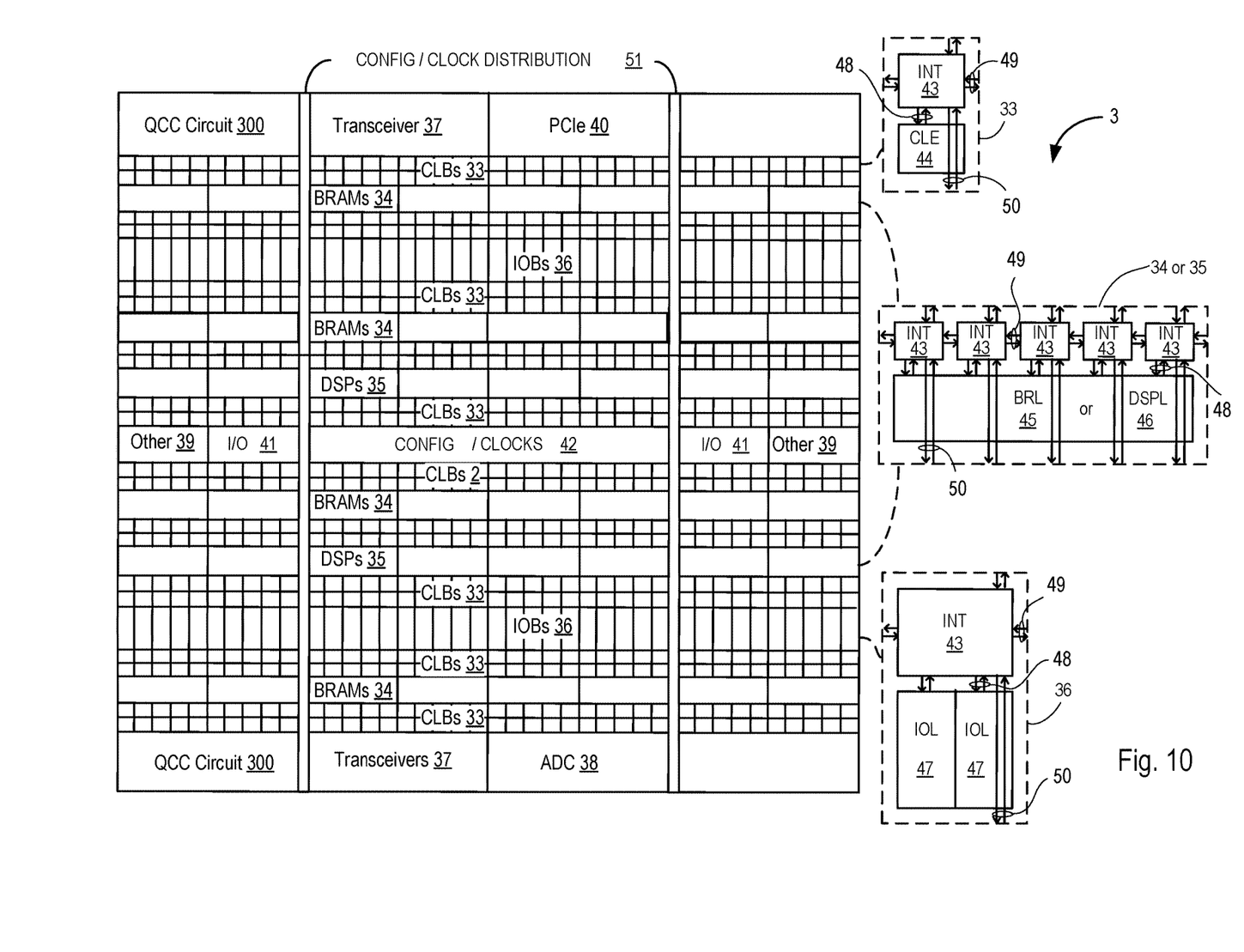
FIG. 10 illustrates a field programmable gate array (FPGA) implementation of a programmable IC in which the QCC circuit described herein can be used.

FIG. 10 illustrates a field programmable gate array (FPGA) implementation of the programmable IC 1 that includes a large number of different programmable tiles including transceivers 37, configurable logic blocks ("CLBs") 33, random access memory blocks ("BRAMs") 34, input/output blocks ("IOBs") 36, configuration and clocking logic ("CONFIG/CLOCKS") 42, digital signal processing blocks ("DSPs") 35, specialized input/output blocks ("I/O") 41 (e.g., configuration ports and clock ports), and other programmable logic 39 such as digital clock managers, analog-to-digital converters, system monitoring logic, and so forth. The FPGA can also include PCIe interfaces 40, analog-to-digital converters (ADC) 38, and the like. The FPGA can include instance(s) of the QCC circuit 300 for used by the transceivers 37 or other circuits.

In some FPGAs, each programmable tile can include at least one programmable interconnect element ("INT") 43 having connections to input and output terminals 48 of a programmable logic element within the same tile, as shown by examples included at the top of FIG. 10. Each programmable interconnect element 43 can also include connections to interconnect segments 49 of adjacent programmable interconnect element(s) in the same tile or other tile(s). Each programmable interconnect element 43 can also include connections to interconnect segments 50 of general routing resources between logic blocks (not shown). The general routing resources can include routing channels between logic blocks (not shown) comprising tracks of interconnect segments (e.g., interconnect segments 50) and switch blocks (not shown) for connecting interconnect segments. The interconnect segments of the general routing resources (e.g., interconnect segments 50) can span one or more logic blocks. The programmable interconnect elements 43 taken together with the general routing resources implement a programmable interconnect structure ("programmable interconnect") for the illustrated FPGA.

In an example implementation, a CLB 33 can include a configurable logic element ("CLE") 44 that can be programmed to implement user logic plus a single programmable interconnect element ("INT") 43. A BRAM 34 can include a BRAM logic element ("BRL") 45 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 35 can include a DSP logic element ("DSPL") 46 in addition to an appropriate number of programmable interconnect elements. An 10B 36 can include, for example, two instances of an input/output logic element ("IOL") 47 in addition to one instance of the programmable interconnect element 43. As will be clear to those of skill in the art, the actual I/O pads connected, for example, to the I/O logic element 47 typically are not confined to the area of the input/output logic element 47.

In the pictured example, a horizontal area near the center of the die (shown in FIG. 10) is used for configuration, clock, and other control logic. Vertical columns 51 extending from this horizontal area or column are used to distribute the clocks and configuration signals across the breadth of the FPGA.

Some FPGAs utilizing the architecture illustrated in FIG. 10 include additional logic blocks that disrupt the regular columnar structure making up a large part of the FPGA. The additional logic blocks can be programmable blocks and/or dedicated logic. Note that FIG. 10 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 10 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing is directed to specific examples, other and further examples may be devised without departing from the basic scope thereof, and the scope thereof is determined by the claims that follow.

What is claimed is:

1. A transmitter, comprising:
   a multiplexer circuit configured to serialize an input signal to generate an output signal based on a four-phase clock signal;
   first and second clock correction circuits that output in-phase and anti-in-phase clock signals, respectively, of the four-phase clock signal;
   third and fourth clock correction circuits that output quadrature-phase and anti-quadrature-phase clock signals, respectively, of the four-phase clock signal, wherein the first, second, third and fourth clock correction circuits are each separate circuits;
   a detector circuit configured to detect duty cycle error and in-phase/quadrature-phase (IQ) phase mismatch in the four-phase clock signal; and
   a calibration circuit configured to supply first and second control signals to each of the first and second clock correction circuits, and third and fourth control signals to each of the third and fourth clock correction circuits, to correct both the duty cycle error and the IQ phase mismatch based output of the detector circuit.

2. The transmitter of claim 1, wherein each of the first, second, third, and fourth clock correction circuits comprises:
   a first inverter;
   a control circuit coupled in parallel with the first inverter.

3. The transmitter of claim 2, wherein the control circuit comprises:
   first and second p-channel transistors, and first and second n-channel transistors, coupled between a supply node and a ground node, where a gate of the second p-channel transistor and a gate of the second n-channel transistor are coupled to an input of the first inverter, and a drain of the second p-channel transistor and a drain of the second n-channel transistor are coupled to an output of the first inverter;
   a first digital-to-analog converter (DAC) coupled to a gate of the first p-channel transistor; and
   a second DAC coupled to a gate of the first n-channel transistor.

4. The transmitter of claim 3, wherein the calibration circuit is coupled to the first DAC and the second DAC in the control circuit in each of the first, second, third, and fourth clock correction circuits.

5. The transmitter of claim 4, wherein the calibration circuit supplies the first and second control signals to the first DAC and the second DAC, respectively, in each of the first and second clock correction circuits, and wherein the calibration circuit supplies the third and fourth control signals to the first DAC and the second DAC, respectively, in each of the third and fourth clock correction circuits.

6. The transmitter of claim 2, wherein each clock correction circuit of the first, second, third, and fourth correction circuits comprises:
   at least one second inverter coupled to the input of the first inverter; and
   at least one third inverter coupled to the output of the first inverter.

7. The transmitter of claim 1, further comprising:
   a clock generator that supplies an in-phase differential clock signal to a first clock buffer having the first and second clock correction circuits and a quadrature-phase differential clock signal to a second clock buffer having the third and fourth correction circuits.

8. The transmitter of claim 1, wherein the calibration circuit supplies a control signal to the detector circuit, and wherein the detector circuit is configured to, in response to the control signal, detect an in-phase duty cycle error, a quadrature-phase duty cycle error, and an IQ phase error.

9. The transmitter of claim 8, wherein the calibration circuit is configured to adjust rising edges or falling edges of the in-phase and anti-in-phase clock signals in response to the in-phase duty cycle error, adjust rising edges or falling edges of the quadrature-phase and anti-quadrature phase clock signals in response to the quadrature-phase duty cycle error, and adjust both the rising edges and the falling edges of either the in-phase and anti-in-phase clock signals, or the quadrature-phase and anti-quadrature-phase clock signals, in response to the IQ phase error.

10. A method of clock correction in a transmitter, comprising:
    outputting in-phase and anti-in-phase clock signals, respectively, of a four-phase clock signal from first and second clock correction circuits;
    outputting quadrature-phase and anti-quadrature-phase clock signals, respectively, of the four-phase clock signal from third and fourth clock correction circuits, wherein the first, second, third and fourth clock correction circuits are each separate circuits;
    detecting, at a detector circuit, duty cycle error and in-phase/quadrature-phase (IQ) phase mismatch in the four-phase clock signal;
    providing first and second control signals to each of the first and second clock correction circuits, and third and fourth control signals to each of the third and fourth clock correction circuits, to correct both the duty cycle error and the IQ phase mismatch based output of the detector circuit.

11. The method of claim 10, wherein the step of providing comprises:
    supplying the first and second control signals to a first digital-to-analog converter (DAC) and a second DAC, respectively, in each of the first and second clock correction circuits; and
    supplying the third and fourth control signals to a first DAC and a second DAC, respectively, in each of the third and fourth clock correction circuits.

12. The method of claim 10, further comprising:
    supplying an in-phase differential clock signal to a first clock buffer having the first and second clock correction circuits and a quadrature-phase differential clock signal to a second clock buffer having the third and fourth clock correction circuits.

13. The method of claim 10, wherein the step of detecting comprises determining an in-phase duty cycle error, a quadrature-phase duty cycle error, and an in-phase-to-quadrature-phase (IQ) phase error.

14. The method of claim 13, wherein the step of providing comprises:
    adjusting rising edges or falling edges of the in-phase and anti-in-phase clock signals in response to the in-phase duty cycle error;
    adjusting rising edges or falling edges of the quadrature-phase and anti-quadrature phase clock signals in response to the quadrature-phase duty cycle error; and adjusting both the rising edges and the falling edges of either the in-phase and anti-in-phase clock signals, or the quadrature-phase and anti-quadrature-phase clock signals, in response to the IQ phase error.

15. A quadrature clock correction (QCC) circuit, comprising:
   first and second clock correction circuits that output in-phase and anti-in-phase clock signals, respectively, of a four-phase clock signal;
   third and fourth clock correction circuits that output quadrature-phase and anti-quadrature-phase clock signals, respectively, of a four-phase clock signal, wherein the first, second, third and fourth clock correction circuits are each separate circuits;
   a detector circuit configured to detect duty cycle error and in-phase/quadrature-phase (IQ) phase mismatch in the four-phase clock signal; and
   a calibration circuit configured to supply first and second control signals to each of the first and second clock correction circuits, and third and fourth control signals to each of the third and fourth clock correction circuits, to correct both the duty cycle error and the IQ phase mismatch based output of the detector circuit.

16. The QCC circuit of claim 15, wherein each of the first, second, third, and fourth clock correction circuits comprises:
   a first inverter;
   a control circuit coupled in parallel with the first inverter.

17. The QCC circuit of claim 16, wherein the control circuit comprises:
   first and second p-channel transistors, and first and second n-channel transistors, coupled between a supply node and a ground node, where a gate of the second p-channel transistor and a gate of the second n-channel transistor are coupled to an input of the first inverter, and a drain of the second p-channel transistor and a drain of the second n-channel transistor are coupled to an output of the first inverter;
   a first digital-to-analog converter (DAC) coupled to a gate of the first p-channel transistor; and
   a second DAC coupled to a gate of the first n-channel transistor.

18. The QCC circuit of claim 17, wherein the calibration circuit is coupled to the first DAC and the second DAC in the control circuit in each of the first, second, third, and fourth clock correction circuits.

19. The QCC circuit of claim 18, wherein the calibration circuit supplies the first and second control signals to the first DAC and the second DAC, respectively, in each of the first and second clock correction circuits, and wherein the calibration circuit supplies the third and fourth control signals to the first DAC and the second DAC, respectively, in each of the third and fourth clock correction circuits.

20. The QCC circuit of claim 15, wherein the calibration circuit supplies a control signal to the detector circuit, and wherein the detector circuit is configured to, in response to the control signal, detect an in-phase duty cycle error, a quadrature-phase duty cycle error, and an in-phase-to-quadrature-phase (IQ) phase error, and wherein the calibration circuit is configured to adjust rising edges or falling edges of the in-phase and anti-in-phase clock signals in response to the in-phase duty cycle error, adjust rising edges or falling edges of the quadrature-phase and anti-quadrature phase clock signals in response to the quadrature-phase duty cycle error, and adjust both the rising edges and the falling edges of either the in-phase and anti-in-phase clock signals, or the quadrature-phase and anti-quadrature-phase clock signals, in response to the IQ phase error.

* * * * *

UNITED STATES PATENT AND TRADEMARK OFFICE
CERTIFICATE OF CORRECTION

PATENT NO. : 10,680,592 B2
APPLICATION NO. : 15/788617
DATED : June 9, 2020
INVENTOR(S) : Hai Bing Zhao et al.

Page 1 of 1

It is certified that error appears in the above-identified patent and that said Letters Patent is hereby corrected as shown below:

In the Claims

Claim 15, Column 13 Line 12, delete "of a" and insert -- of the --, therefor.

Signed and Sealed this
Twentieth Day of April, 2021

Drew Hirshfeld
*Performing the Functions and Duties of the*
*Under Secretary of Commerce for Intellectual Property and*
*Director of the United States Patent and Trademark Office*